(12) United States Patent
Uchida

(10) Patent No.: US 8,345,722 B2
(45) Date of Patent: Jan. 1, 2013

(54) METHOD OF DRIVING SEMICONDUCTOR LASER

(75) Inventor: Takeshi Uchida, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 69 days.

(21) Appl. No.: 13/075,977

(22) Filed: Mar. 30, 2011

(65) Prior Publication Data
US 2011/0249693 A1 Oct. 13, 2011

(30) Foreign Application Priority Data

Apr. 7, 2010 (JP) ................. 2010-088336

(51) Int. Cl.
*H01S 3/00* (2006.01)
(52) U.S. Cl. ............. 372/38.02; 372/29.01; 372/29.015; 372/38.07; 372/38.1
(58) Field of Classification Search ............... 372/29.01, 372/29.015, 38.02, 38.07
See application file for complete search history.

(56) References Cited

U.S. PATENT DOCUMENTS

| 4,728,989 A * | 3/1988 | Ohmori ..................... 347/132 |
| 5,159,184 A * | 10/1992 | Egawa et al. .............. 250/205 |
| 2011/0236047 A1 * | 9/2011 | Koga ......................... 399/51 |

FOREIGN PATENT DOCUMENTS

| JP | 2001-315381 | 11/2001 |
| JP | 2002-333476 | 11/2002 |

* cited by examiner

*Primary Examiner* — Dung Nguyen
(74) *Attorney, Agent, or Firm* — Fitzpatrick, Cella, Harper & Scinto

(57) ABSTRACT

The present invention provides a method of driving a semiconductor laser, where the method can control changes in the internal temperature of a device as well as control optical output using a driving current. A method of driving a semiconductor laser includes steps of: preliminary driving the semiconductor laser by preliminary activating at a current value larger than a threshold value; de-activating the semiconductor laser, after the step of preliminary driving; and starting a formation of a latent image on a photosensitive drum based on a latent image formation signal, after the step of de-activating.

7 Claims, 5 Drawing Sheets

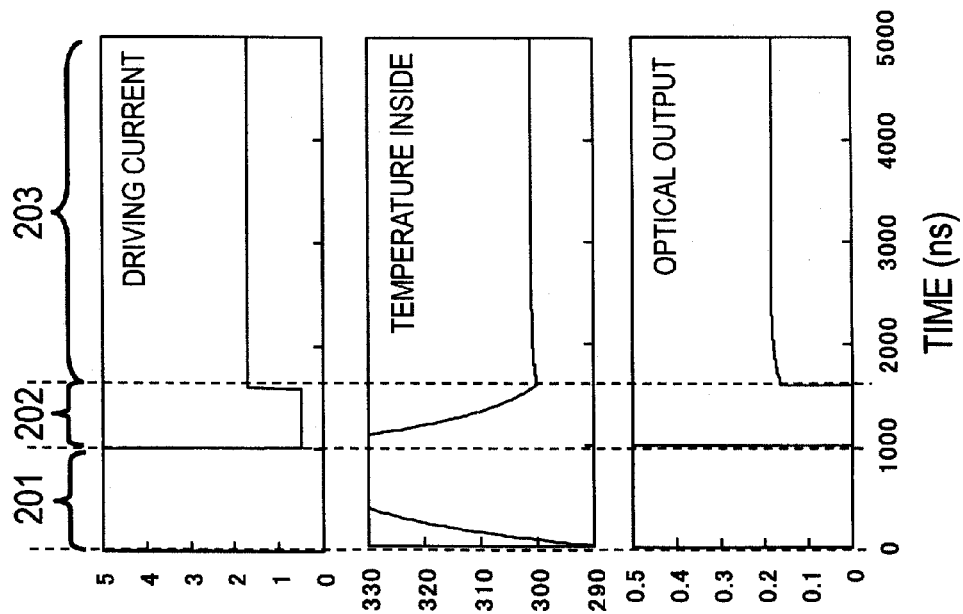
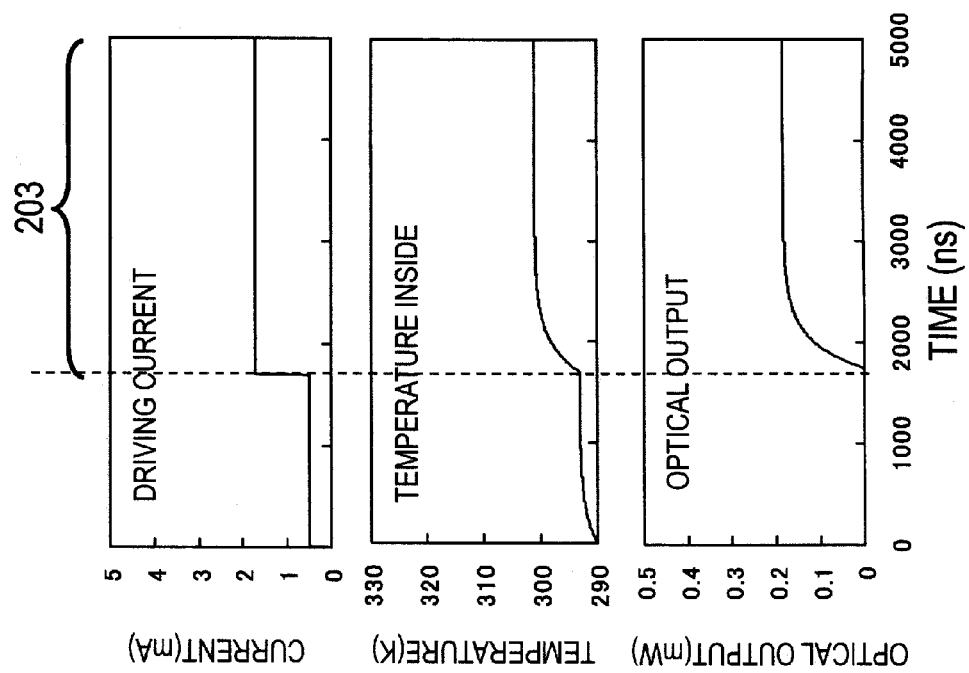

METHOD OF DRIVING SEMICONDUCTOR LASER

BACKGROUND OF THE INVENTION

1. Field of the Invention

The present invention relates to a method of driving a semiconductor laser.

2. Description of the Related Art

A vertical-cavity surface-emitting laser (hereinafter abbreviated to VCSEL) is a laser which emits a laser beam vertically to a substrate.

The VCSEL laser has some advantages including the advantage of being able to be organized easily into a high-density, two-dimensional array, and a VCSEL array created by densely packing VCSEL lasers enables higher definition and faster speed when used for electrophotography.

In application to electrophotography, to form a latent image on a photosensitive drum, it is necessary to strictly control light quantity on a pulse by pulse basis.

To emit target light quantity accurately, the optical output power emitted from VCSEL is controlled by controlling driving current and drive time (pulse width) per pulse.

However, even if a driving current of a square waveform is applied, the VCSEL does not produce a square, stable optical output power, and consequently a delay occurs in the start of the optical output power emission.

To reduce such a startup delay, a technique described in Japanese Patent Application Laid-Open No. 2001-315381 improves the rise of an light waveform by generating a current waveform with a bias current not higher than a threshold value inserted in front of an image formation signal.

To improve the rise of the light waveform, the technique described in Japanese Patent Application Laid-Open No. 2001-315381 is configured to apply a current bias not higher than the threshold value for a predetermined period of time before each image formation pulse.

The technique described in Japanese Patent Application Laid-Open No. 2001-315381 improves the rise of the light waveform by applying a current bias not higher than the threshold value.

However, the VCSEL has a problem in that the optical output power cannot be controlled by the driving current alone because internal temperature of the VCSEL rises greatly during driving, device characteristics are sensitive to temperature, and the optical output power varies greatly with the temperature even if the same current is injected.

To describe further, in the application to electrophotography, there is a period of time during which the VCSEL is de-activated because the beam is located outside a photosensitive drum in addition to the period during which the VCSEL is being driven.

The de-activation period (a few tens of milliseconds or longer) is longer than a time constant (a few milliseconds) of VCSEL temperature changes.

Consequently, there occurs a phenomenon in which the temperature inside the VCSEL falls during the time interval between the end of driving for latent image formation and the start of the next latent image formation, and the internal temperature rises again at the start of driving.

The VCSEL undergoes greater rises in the internal temperature when emitting required optical output power (e.g., 1 mW) than does an edge-emitting laser. Furthermore, the VCSEL has the property of varying greatly in optical output power with the internal temperature.

Therefore, when the VCSEL is used as a laser source, the temperature inside the VCSEL changes from the start of latent image formation, causing a problem in that the optical output power varies from pulse to pulse even if the VCSEL is driven by a fixed value of current.

Also, in electrophotography, automatic power control (APC) cannot be used during light emission for latent image formation, and thus the variation in optical output with the internal temperature cannot be corrected using APC.

That is, the optical output power needs to be controlled solely by controlling the value of current used to drive the VCSEL. For that, an optical output waveform is required to have a short rise time upon injection of a fixed current and subsequently maintain a constant value.

For this purpose, with the VCSEL whose characteristics change greatly with temperature, the internal temperature of the device needs to be kept constant.

In view of the above problems, the present invention has an object to provide a method of driving a semiconductor laser, where the method can control changes in the internal temperature of a device as well as control optical output power using a driving current.

SUMMARY OF THE INVENTION

An object of the present invention is to provide a method of driving a semiconductor laser, capable of suppressing a change in an internal temperature of a device, and capable of controlling an optical output power based on a driving current.

A method of driving a semiconductor laser according to the present invention comprises steps of: preliminary driving the semiconductor laser by preliminary activating at a current value larger than a threshold value; de-activating the semiconductor laser, after the step of preliminary driving; and forming a latent image on a photosensitive dram based on a latent image forming signal, after the step of de-activating, wherein the current value in the step of preliminary driving is larger than a current value for an activation based on the latent image forming signal.

Further features of the present invention will become apparent from the following description of exemplary embodiments with reference to the attached drawings.

BRIEF DESCRIPTION OF THE DRAWINGS

FIGS. 2A and 2B are a diagram showing results of numerical analysis of internal temperature and optical output power when the drive method according to the present invention is used and when only a latent image formation signal is input.

DESCRIPTION OF THE EMBODIMENTS

Preferred embodiments of the present invention will now be described in detail in accordance with the accompanying drawings.

A method of driving a vertical-cavity surface-emitting laser (VCSEL) mounted on an electrophotographic system according to an exemplary embodiment of the present invention will be described.

A method of driving a VCSEL according to the present exemplary embodiment is configured to increase temperature inside a device by driving the device by a predetermined current only for a predetermined period of time when a beam is located outside a photosensitive drum and then control changes in the internal temperature of the device from the start of latent image formation.

Next, a VCSEL drive method according to the present invention will be described with reference to FIG. 1.

Figure 1:
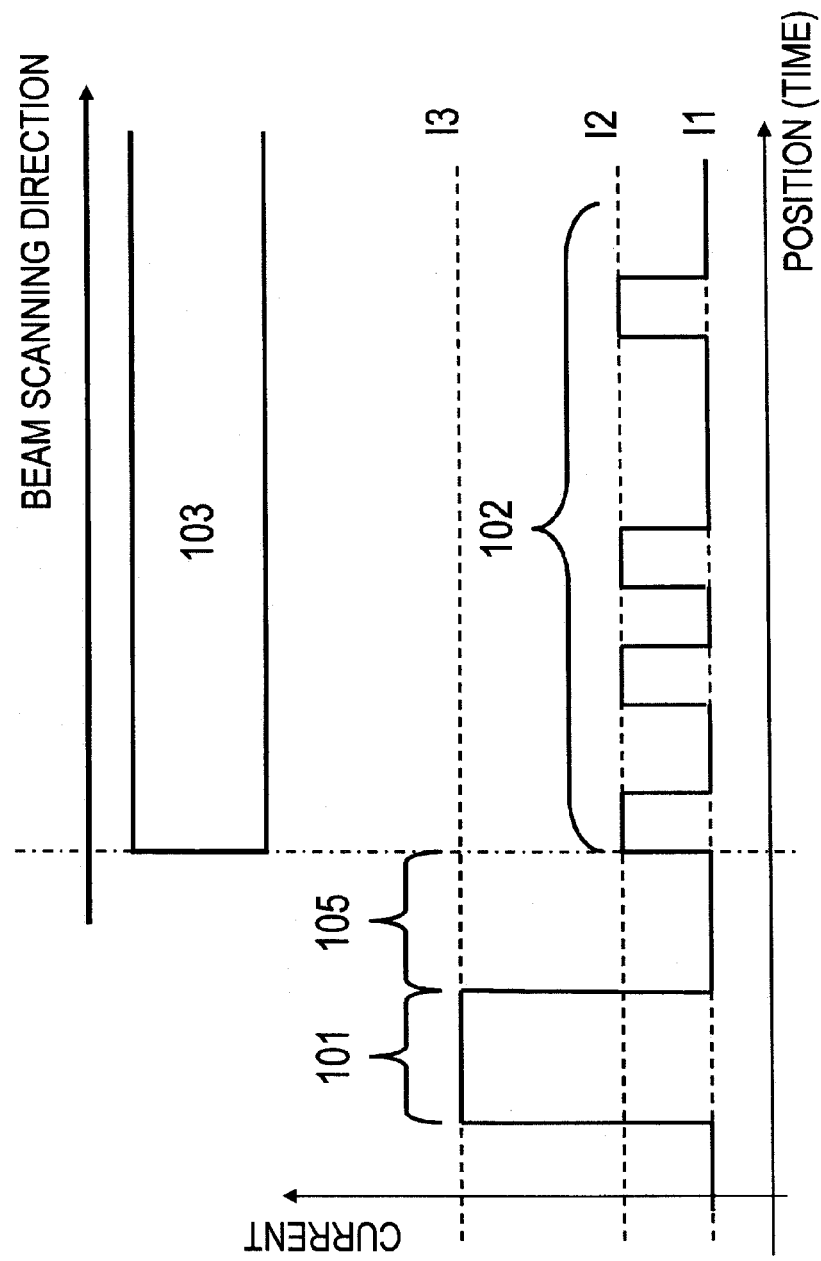
FIG. 1 is a diagram illustrating a method of driving a vertical-cavity surface-emitting laser, according to an exemplary embodiment of the present invention.

FIG. 1 schematically shows a pattern of a driving current and position of a beam with respect to a photosensitive drum 103, where the beam is scanned from left to right in FIG. 1.

According to the present invention, an activation pattern 101 is introduced to control the temperature inside the device before activation of a latent image formation signal 102, and a de-activation period 105 is introduced to de-activate the VCSEL for a predetermined period of time before the activation pattern 101 and latent image formation signal 102 are started to be activated.

This optimally controls the temperature in the device.

In this way, as the internal temperature of the device is controlled to an optimum value at the time when light emission is started by the latent image formation signal 102, subsequent temperature variations and resulting output variations can be reduced.

Time variation of internal temperature and time variation of optical output power caused by the activation pattern 101 for temperature control according to the present exemplary embodiment will be described with reference to FIGS. 2A and 2B.

FIG. 2A shows a case where only a signal 203 regarded to be a latent image formation signal is input and FIG. 2B shows a case where activation 201 for device temperature control and a de-activation period 202 are provided before the latent image formation signal 203 is started to be activated.

An environmental temperature assumed by calculations is 25° C.

In FIG. 2A, the internal temperature rises gradually upon activation (1700-ns position) of the latent image formation signal 203, and the optical output power increases accordingly.

This is because a VCSEL's threshold value of a current-optical output power characteristic has temperature dependence and the threshold value tends to fall at temperatures from room temperature to a certain temperature.

When a certain time passes from the activation of the latent image formation signal 203, the internal temperature becomes constant, and the optical output power stabilizes accordingly.

That is, when the VCSEL is used for electrophotography, if a write is started from a photosensitive drum edge, the internal temperature of the device becomes room temperature as described above.

Consequently, when activation is started based only on the latent image formation signal 203, the internal temperature of the device changes transiently. Then, even if the VCSEL is driven by a constant current, light quantity will change on a pulse by pulse basis.

On the other hand, in FIG. 2B, before a laser beam is emitted to form a latent image, the laser is driven beforehand by a current value equal to or higher than the threshold value for a predetermined period.

Specifically, such preliminary driving is done by means of activation 201 (hereinafter referred to as preliminary activation) intended to control the internal temperature by a current of 6 mA for a period of 1000 ns, before the latent image formation signal 203 is started to be activated (1700 ns).

A de-activation period 202 (activation of bias only) of 700 ns is provided between the preliminary activation 201 and the activation of the latent image formation signal 203.

In this case, the internal temperature of the device rises as a result of the preliminary activation 201 and then falls during the de-activation period 202.

Then, the temperature at the activation start time (1700 ns) of the latent image formation signal 203 becomes approximately equal to steady-state temperature (the internal temperature which has entered a steady state after passage of sufficient time from the start of activation in FIGS. 2A and 2B).

Consequently, if the latent image formation signal 203 is activated from this point, the temperature of the device hardly fluctuates. As a result, the optical output power becomes constant and does not change with time.

The temperature inside the device rises with the preliminary activation 201, and then falls during the de-activation period 202. Subsequently, the temperature becomes balanced with heat resulting from the activation of the latent image formation signal 203 and settles at a value.

That is, preferably the temperature rise caused by the preliminary activation 201 is greater than the value settled by the activation of the latent image formation signal 203. For that, it is necessary to perform preliminary activation 201 using a current value higher than the current value of the activation of the latent image formation signal 203.

Here, heat generating quantity required of the preliminary activation 201 will be described.

If a time constant of temperature change inside the device is $\tau$, an average heat generating quantity during latent image formation is $W_1$, the de-activation period 202 is $t_1$, and a period of preliminary activation 201 is $t_0$, then desirable heat generating quantity $W_0$ for the preliminary activation 201 needs to satisfy the relationship given by Equation (1) below.

$$W_0 = \frac{W_1}{\exp\left(-\frac{t_1}{\tau}\right) \cdot \left[1 - \exp\left(\frac{-t_0}{\tau}\right)\right]} \quad (1)$$

Of the parameters used in Equation (1), a parameter unique to the device is only the time constant $\tau$ of temperature change inside the device.

If the time constant is measured beforehand, the heat generating quantity $W_0$ of the preliminary activation 201 and length $t_1$ of the de-activation period 202 can be decided appropriately by the system so as to meet Equation (1).

The time constant $\tau$ of temperature change inside the device even if the device is used for a long time is resistant to change and this provides a reliable control method.

Incidentally, although the vertical-cavity surface-emitting laser (VCSEL) whose characteristics vary sensitively with the temperature, in particular, has been described above out of semiconductor lasers, the present invention is not limited to VCSEL.

The present invention is also applicable to drive methods for semiconductor lasers other than those with VCSEL structure.

EMBODIMENTS

Embodiments of the present invention will be described below.

First Embodiment

A configuration example of an electrophotographic apparatus resulting from application of the present invention will be described as a first embodiment with reference to FIGS. 3A and 3B.

Figure 3A:
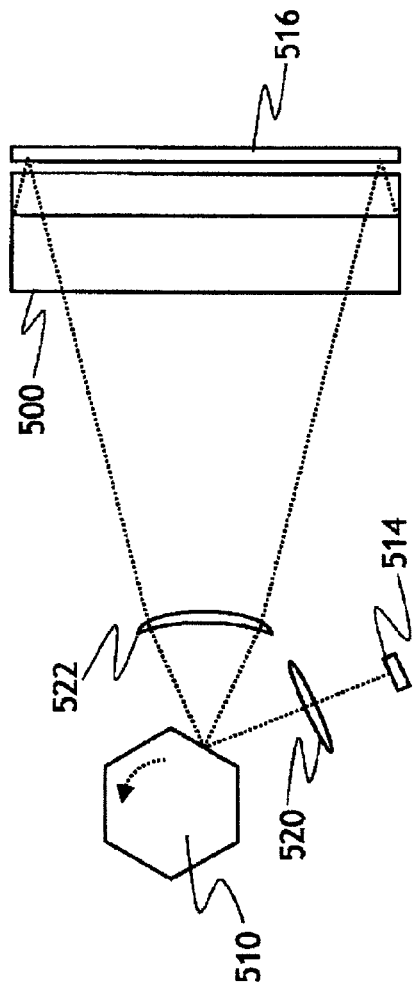
FIGS. 3A and 3B are a diagram showing a structure of an electrophotographic apparatus according to a first embodiment.
Figure 3B:
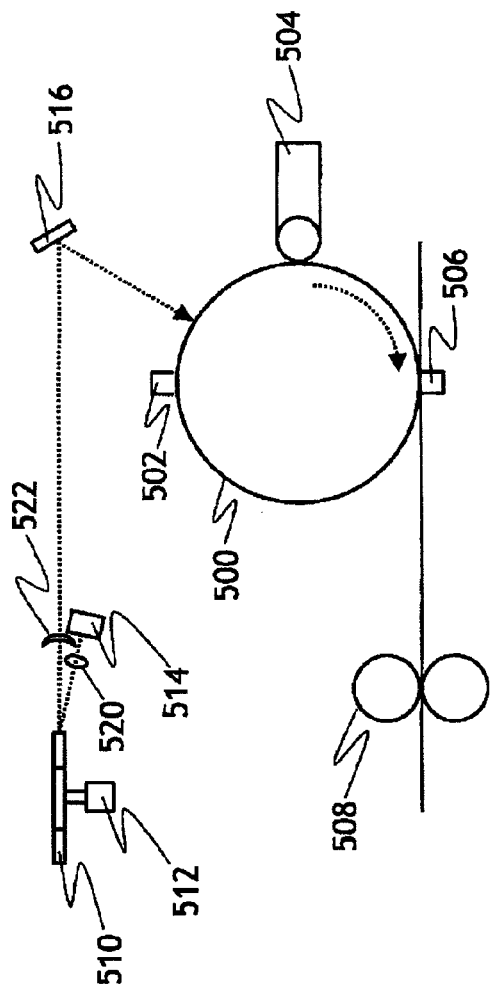

FIG. 3A is a plan view of an image forming apparatus, and FIG. 3B is a side view of the image forming apparatus.

In FIGS. 3A and 3B, the image forming apparatus includes a photosensitive drum 500, an electrostatic charger 502, a developing device 504, a transfer charger 506, a fixing device 508, a rotating polygon mirror 510 and a motor 512. Also, the image forming apparatus includes a VCSEL 514, a reflecting mirror 516, a collimator lens 520 and an f-θ lens 522.

In FIGS. 3A and 3B, the motor 512 rotationally drives the rotating polygon mirror 510.

The rotating polygon mirror 510 according to the present embodiment includes six reflecting surfaces.

The VCSEL 514, which serves as a recording light source, is adapted to be activated or de-activated by a laser driver (not shown) according to an image signal.

The laser beam optically modulated in this way is directed from the VCSEL 514 onto the rotating polygon mirror 510 through the collimator lens 520.

The rotating polygon mirror 510 rotates in the direction of arrow, and the laser beam output from the VCSEL 514 is reflected as a deflection beam which changes its emergence angle continually on the reflecting surfaces of the polygon mirror 510 along with the rotation of the rotating polygon mirror 510.

The reflected beam has distortion aberration corrected by the f-θ lens 522. Then, the reflected beam is directed at the photosensitive drum 500 after passing through the reflecting mirror 516, and scanned on the photosensitive drum 500 in a main scanning direction.

Then, during scanning by the rotating polygon mirror 510, just before the photosensitive drum 500 is scanned, the VCSEL 514 is preliminarily activated and then de-activated for a prescribed de-activation period.

Consequently, for the reason described above, the internal temperature of the VCSEL 514 can be controlled to an optimum value, allowing stable optical output power to be obtained by means of a current for latent image formation, and thereby enabling higher-quality printing.

Figure 4:
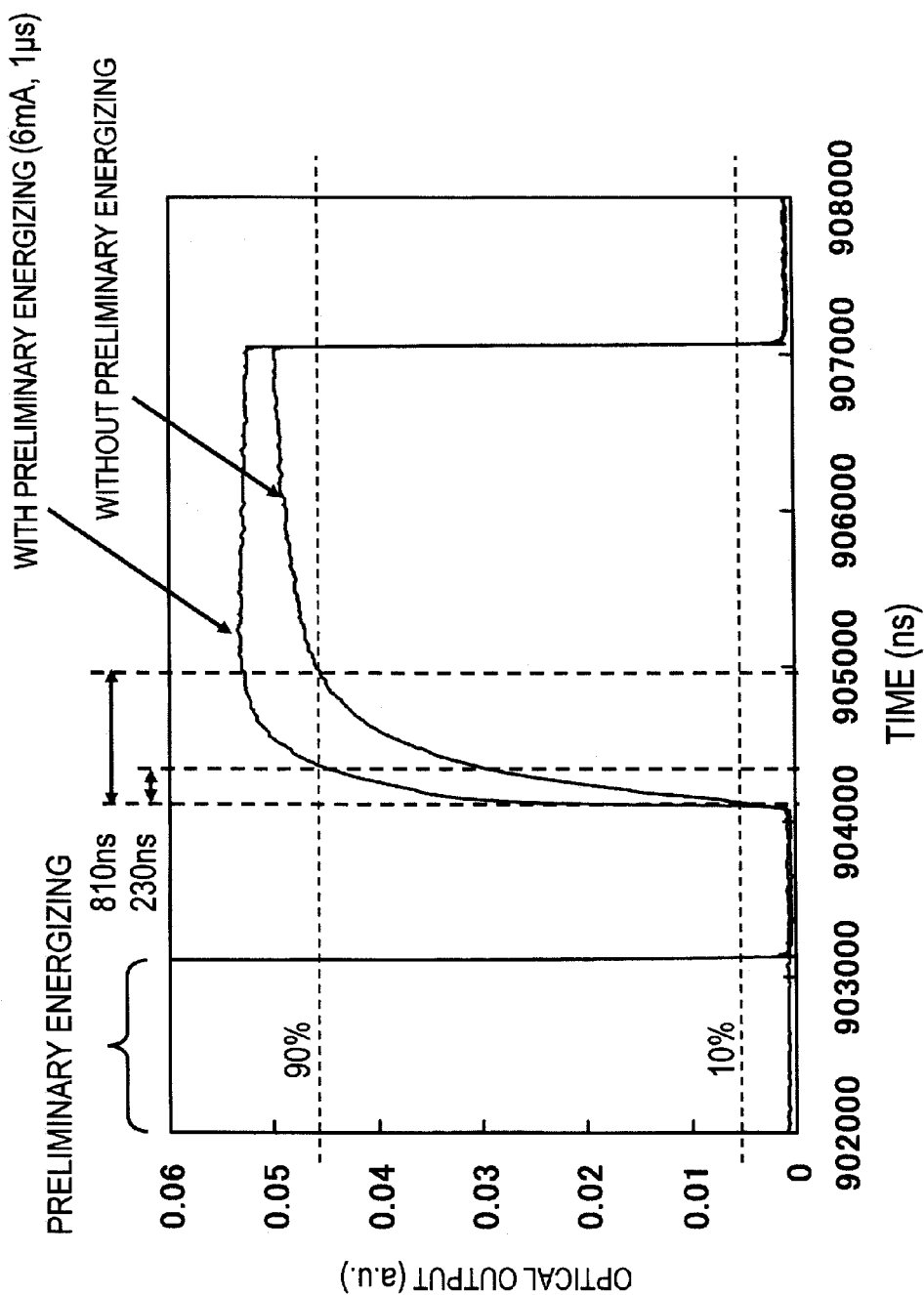
FIG. 4 is a diagram showing experimental results of rising waveforms of a VCSEL with or without preliminary activation, according to the first embodiment.

FIG. 4 shows experimental results of rising waveforms of a VCSEL with or without preliminary activation.

With an ordinary drive method without preliminary activation, it can be seen that the optical output power is weak at the beginning, and then rises slowing, taking a long time.

It takes 810 ns to rise from 10% to 90% of the optical output power in a state stable. In contrast, with preliminary activation, it can be seen that the optical output power is more stable from the start of the rise. The VCSEL here achieves a more stable rise when activated by 6 mA for 1 μs and then de-activated for 1 μs.

Under the condition of preliminary activation, the time required to rise from 10% to 90% of the optical output power in a state stable is 230 ns, meaning that the rise time is reduced to about ¼.

The reason why the de-activation period is provided is to position the beam well away from the edge of the photosensitive drum 500 at the time of preliminary emission.

When the beam is close to the photosensitive drum 500, light may hit the photosensitive drum 500 although slightly, degrading the quality of the latent image.

Therefore, the VCSEL is de-activated at a position well away from the photosensitive drum 500 instead of being preliminarily driven to a position just in front of the photosensitive drum 500.

During de-activation, although no light is emitted, the internal temperature falls gradually from the point reached as a result of the preliminary driving, and inside the VCSEL, changes are taking place inside the internal temperature due to the influence of the preliminary driving.

Then, the de-activation period and the rate of fall of the internal temperature in combination reduce changes in the internal temperature of the VCSEL after the start of latent image formation, achieving stable optical output power.

That is, the de-activation period has the effect of regulating the internal temperature in addition to the effect of preventing the photosensitive drum 500 from being exposed to the emission resulting from the preliminary driving.

Second Embodiment

A configuration example in which the VCSELs according to the present invention are arranged densely in a two-dimensional array will be described as a second embodiment with reference to FIG. 5.

Figure 5:
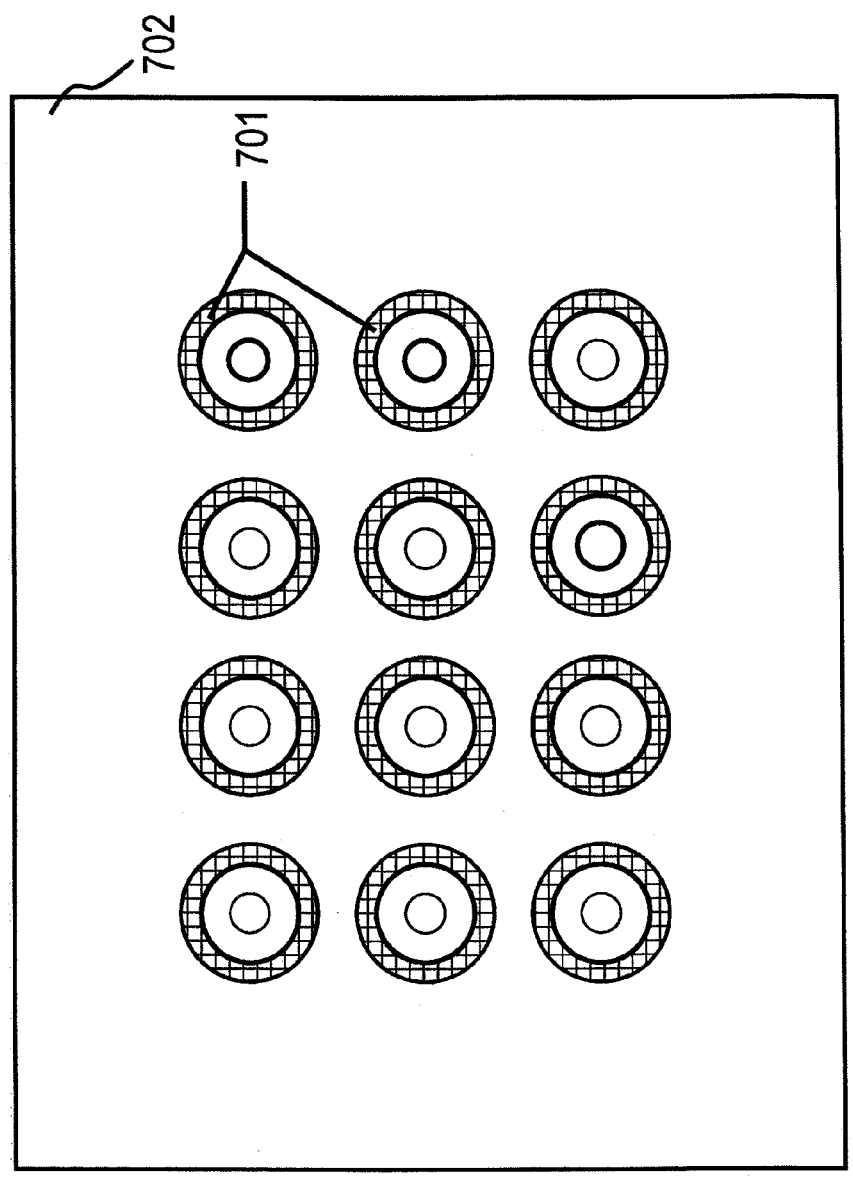
FIG. 5 is a diagram showing a configuration example in which vertical-cavity surface-emitting lasers according to a second embodiment are arranged densely in an array.

As shown in FIG. 5, devices 701 are arranged in a 3×4 array on a substrate 702. The present embodiment is similar to the first embodiment in that light emission for latent image formation is started after preliminary activation and a de-activation period which are provided on a device by device basis, and thus description thereof will be omitted.

When devices are used in an array form, the emission start time of the devices varies from device to device.

Therefore, in driving the array, the conditions of preliminary driving need to be varied among the devices by regulating the de-activation period and the heat generating quantity of preliminary driving based on Equation (1).

Also, in an array, each device is subject to thermal interference from surrounding devices in addition to the heat generated by itself.

The time constant of changes in the thermal interference from other devices is different from the time constant of internal temperature rises in the device itself.

Generally, the time constant of thermal interference among devices is 10 times or more larger.

However, the time constant of thermal interference changes with the device pitch, substrate thickness and the like, and thus can sometimes approach the time constant of internal temperature rises caused by self-heating. In such a case, if chips are driven as an array, it is necessary to consider the difference in time constant between the heat generated by the chip itself and the thermal interference among chips.

Incidentally, although a configuration example in which VCSELs are arranged in a two-dimensional array has been described above, the VCSELs may be arranged in a one-dimensional array.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2010-088336, filed Apr. 7, 2010, which is hereby incorporated by reference herein in its entirety.

What is claimed is:

1. A method of driving a semiconductor laser comprising steps of:
   preliminary driving the semiconductor laser by preliminary activating at a current value larger than a threshold value;
   de-activating the semiconductor laser, after the step of preliminary driving; and
   driving the semiconductor laser for formation of a latent image on a photosensitive drum based on a latent image forming signal, after the step of de-activating, wherein
   the current value in the step of preliminary driving is larger than a current value for an activation based on the latent image forming signal.

2. The method according to claim 1, wherein
   the semiconductor laser is a vertical-cavity surface emitting laser.

3. The method according to claim 1, wherein
   a heat quantity generated in the step of preliminary driving meet a relation:

$$W_0 = \frac{W_1}{\exp\left(-\frac{t_1}{\tau}\right) \cdot \left[1 - \exp\left(\frac{-t_0}{\tau}\right)\right]} \quad (1)$$

wherein $W_0$ is the heat quantity generated in the step of preliminary driving, $\tau$ is a time constant of temperature change inside of the semiconductor laser, $W_1$ is an average heat quantity generated during the formation of the latent image, $t_1$ is a period of the de-activating, and $t_0$ is a period of the preliminary activating.

4. A method of driving a semiconductor laser, wherein
   a plurality of laser are arranged in one dimensional or two dimensional array, and each of the plurality of lasers is driven by the method according to claim 1.

5. An electrophotographic apparatus comprising:
   a semiconductor laser;
   a laser driver configured to control activation and de-activation of the semiconductor laser
   a photosensitive drum;
   wherein the laser driver is configured to drive the semiconductor laser by preliminary activation at a current value larger than a threshold value; de-activate the semiconductor laser after driving the semiconductor laser by the preliminary activation;
   and drive the semiconductor laser for formation of a latent image on the photosensitive drum based on a latent image forming signal after the de-activation of the semiconductor laser,
   wherein the current value for driving by the preliminary activation is larger than a current value for an activation based on the latent image forming signal.

6. The electrophotographic apparatus according to claim 5, wherein the semiconductor laser is a vertical-cavity surface emitting laser.

7. The electrophotographic apparatus according to claim 5, wherein a heat quantity generated in the preliminary activation meet a relation:

$$W_0 = \frac{W_1}{\exp\left(-\frac{t_1}{\tau}\right) \cdot \left[1 - \exp\left(\frac{-t_0}{\tau}\right)\right]} \quad (1)$$

wherein $W_0$ is the heat quantity generated in the preliminary activation, $\tau$ is a time constant of temperature change inside of the semiconductor laser, $W_1$ is an average heat quantity generated during the formation of the latent image, $t_1$ is a period of the de-activation, and $t_0$ is a period of the preliminary activation.

* * * * *